United States Patent [19]
Yu

[11] Patent Number: 5,770,952
[45] Date of Patent: Jun. 23, 1998

[54] TIMER THAT PROVIDES BOTH SURVEYING AND COUNTING FUNCTIONS

[75] Inventor: Kuo-Cheng Yu, Hsinchu, Taiwan

[73] Assignee: Holtek Microelectronics Inc., Hsinchu, Taiwan

[21] Appl. No.: 489,778

[22] Filed: Jun. 13, 1995

[51] Int. Cl.$^6$ .................................................. H03K 5/135
[52] U.S. Cl. ............................... 327/31; 327/99; 327/298
[58] Field of Search ........................... 327/31, 36, 38–41, 327/43–45, 47–49, 99, 457, 291, 294, 298, 144, 151, 160

[56] References Cited

U.S. PATENT DOCUMENTS

| | | | |
|---|---|---|---|
| 5,107,523 | 4/1992 | Heaney et al. | 327/44 |
| 5,128,973 | 7/1992 | Sasaki et al. | 327/44 |
| 5,300,820 | 4/1994 | Sayama et al. | 327/31 |
| 5,416,435 | 5/1995 | Jokinen et al. | 327/45 |
| 5,483,185 | 1/1996 | Scriber et al. | 327/99 |
| 5,510,742 | 4/1996 | Lemaire | 327/407 |

FOREIGN PATENT DOCUMENTS

| | | | |
|---|---|---|---|
| 62-85511 | 4/1987 | Japan | 327/99 |
| 62-272617 | 11/1987 | Japan | 327/99 |
| 63-232615 | 9/1988 | Japan | 324/144 |
| 5-268022 | 10/1993 | Japan | 327/99 |

*Primary Examiner*—Timothy P. Callahan
*Assistant Examiner*—T. T. Lam
*Attorney, Agent, or Firm*—W. Wayne Liauh

[57] ABSTRACT

A timer which provides both the surveying and counting functions. It contains a counter, a multiplexer, an edge-triggered controller, a time-base latching circuit, and a pulse-detecting circuit. It not only can be used as a timer, but can also be used as a counter to count the number of the external signals so as to detect the width of an external signal.

8 Claims, 8 Drawing Sheets

TIMER THAT PROVIDES BOTH SURVEYING AND COUNTING FUNCTIONS

BACKGROUND OF THE INVENTION

Figure 1:
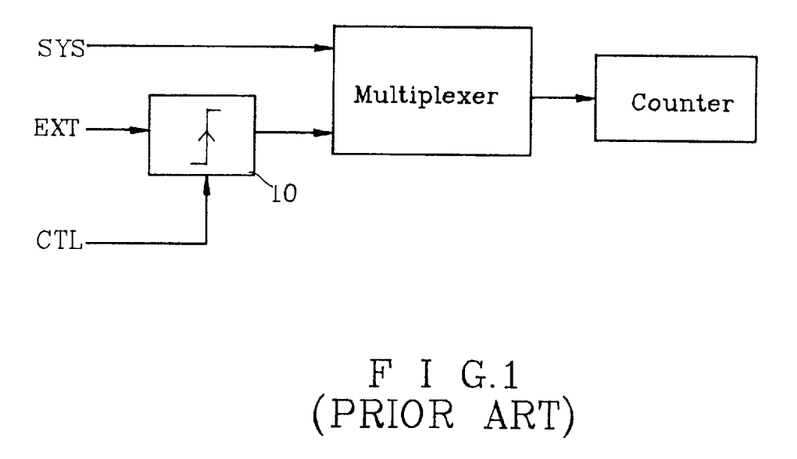
FIG. 1 is a block diagram of a conventional timer.

A conventional timer usually comprises a counter, a multiplexer MUX and an edge-triggered controller as shown in FIG. 1, in which the multiplexer is used for switching the clock signal of the counter, and for selecting the system clock or the external signal. The edge-triggered controller 10 is used for selecting the triggering edge of the external signal. The counter is used to perform the inner counting operation. The aforesaid system can operate in two modes: (1) to select the system clock by using a known frequency to be divided to obtain a given period of time, this mode is usually used for counting time; and (2) to select the clock source of an external signal when the signal is passing therethrough so as to count the number of the external signals.

In brief, the signal source of the aforesaid conventional timer can only process either the system clock or the number of external signals. In the event the width of an external signal is to be surveyed but not the number of triggering signals, the conventional timer will be unable to provide such function.

SUMMARY OF THE INVENTION

This invention relates to a timer that provides the functions of both surveying and counting. It comprises a counter, a multiplexer, an edge-triggered controller, a time-base latching circuit and a pulse-detecting circuit. The novel timer disclosed in the present invention not only provides a timing function and counts the number of external signals, it can also survey the width of an external signal. In other words, the novel timer disclosed in the present invention can provide additional function without reducing the original functions thereof.

The prime object of the present invention is thus to provide a timer, which can provide additional function by means of a signal selection method to reinforce the original functions thereof. The prime features of the timer disclosed in the present invention are that, by means of an edge-triggered controller, the positive or negative half cycle of an external signal pulse can be selected, while the pulse-detecting circuit can survey the width of external signals.

DETAILED DESCRIPTION

Figure 3:
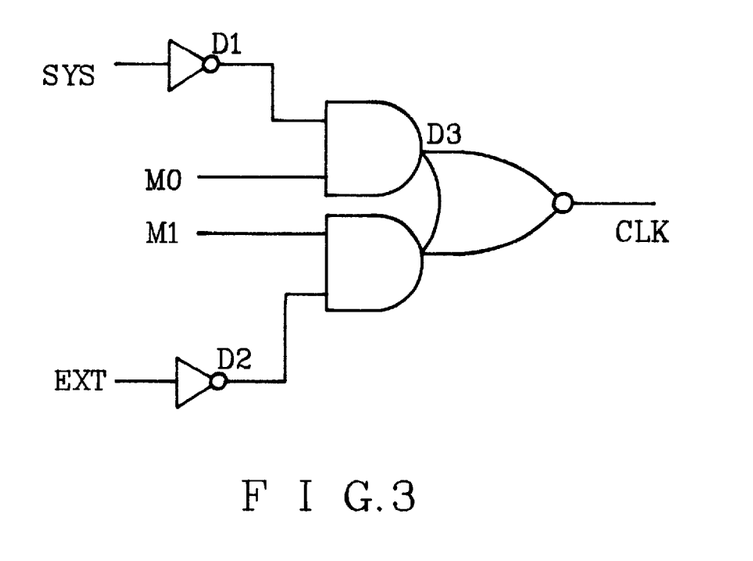
FIG. 3 is digital logic circuit diagram of a multiplexer according to the present invention.

Referring to FIG. 3, the digital logic circuit of a multiplexer is shown, in which there is a set of parameters to be selected M1 and M0. When M1=0 and M0=1, the clock signal CLK is equal to the system clock SYS, and it is a timing operation mode. When M1=1 and M0=0, the clock signal CLK is an external signal EXT; it is a counting mode. When M1=1 and M0=1, the clock signal CLK is performing a logic "AND" function by means of the system clock SYS and the external signal EXT, i.e., the clock signal will have the system clock SYS only when the external signal EXT=1; if the external signal EXT=0, there will be no system signal SYS. When M1=0and M0=0, it is the clock inhibit area; such case must be avoided; the truth table thereof is shown as follows:

M1=0 and M1=0, CLK=SYS → Timer mode;

M1=1 and M0=0, CLK=EXT → mode;

M1=1 and M0=1, CLK=SYS AND EXT → Pulse width' mode;

M1=0 and M0=0, CLK inhibit.

Figure 4:
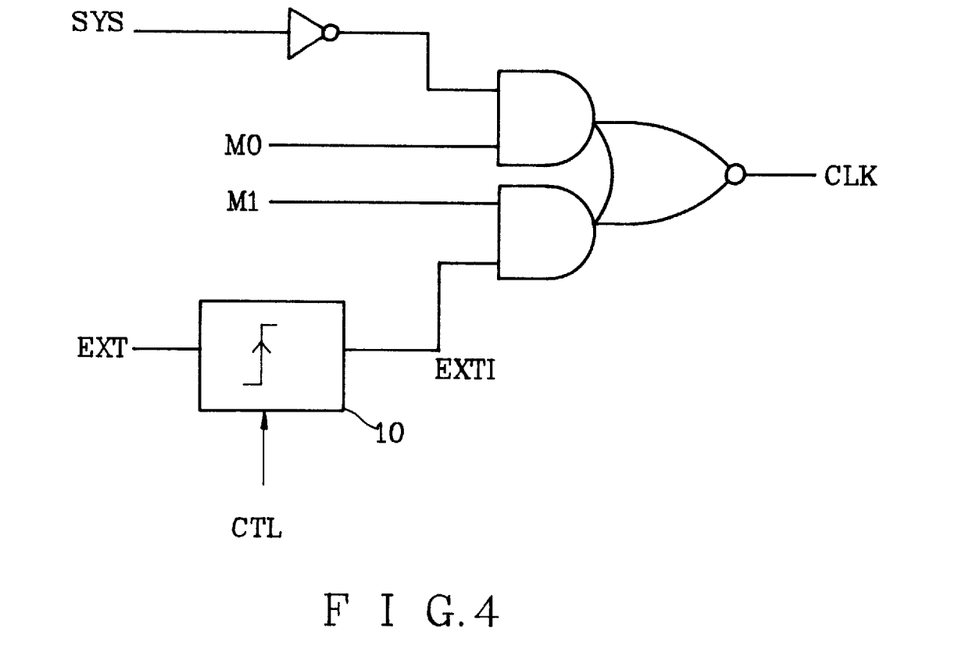
FIG. 4 is a digital logic circuit diagram of a multiplexer that uses an edge-triggered controller according to the present invention.
Figure 6:
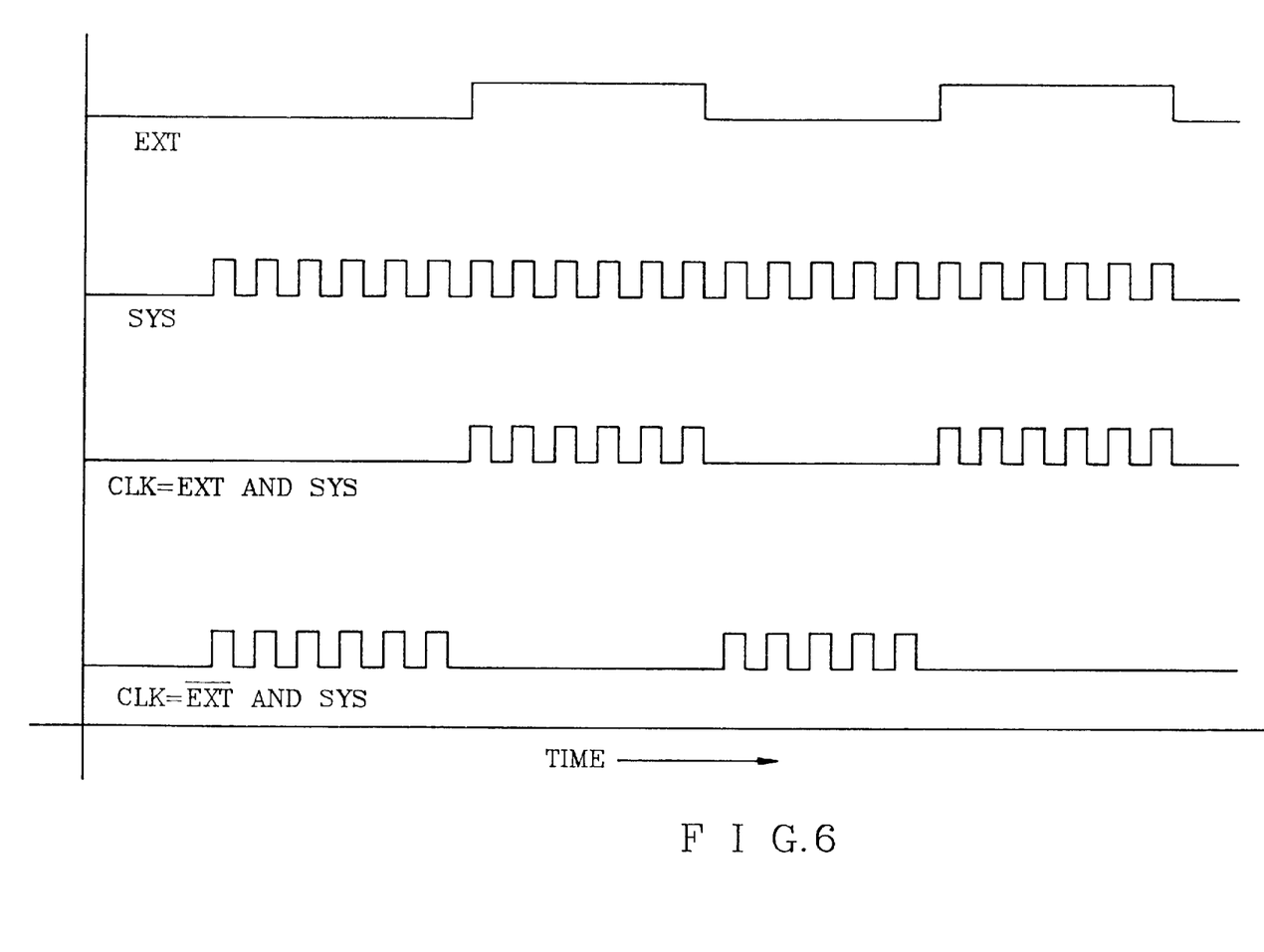
FIG. 6 is a timing diagram generated by the multiplexer according to the present invention.

Referring to FIG. 6, which shows a timing diagram of the multiplexer according to the present invention. As soon as the external signal EXT terminal is known, regardless of whether it is in-phase or not, the HIGH/LOW pulses of a signal to be surveyed can be used as a surveying object. In order to obtain the aforesaid function, the D2 as shown in FIG. 3 is replaced with an edge-triggered controller 10 (as shown in FIG. 4 ), which is to be controlled with a control signal CTL, i.e., when CTL=1, EXT1 =EXT;

when CTL=0, EXT1 =$\overline{EXT}$.

Figure 5:
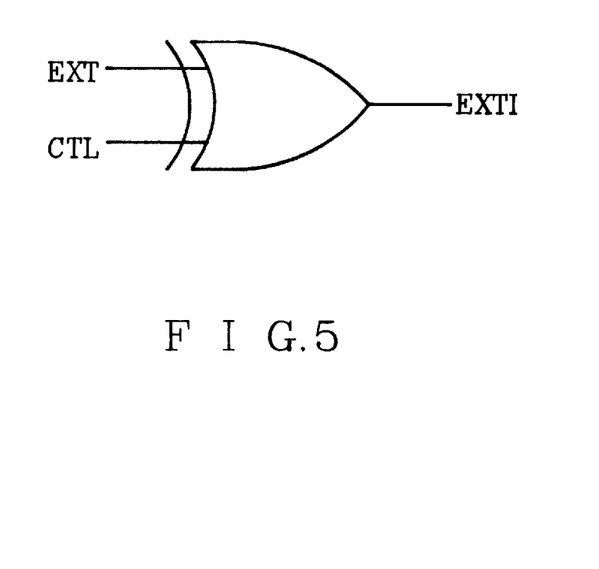
FIG. 5 is a digital logic circuit diagram of the edge-triggered controller according to the present invention.

For example, the clock signal CLK will provide a positive edge triggering to a counter when the control signal CTL=1, the external signal EXT will provide a positive edge triggering to the counter. When the control signal CTL=0, the external signal EXT will provide a negative edge triggering (as shown in FIG. 6). FIG. 5 illustrates a digital logic circuit for an edge-triggered controller, which is an exclusive OR gate.

Figure 2:
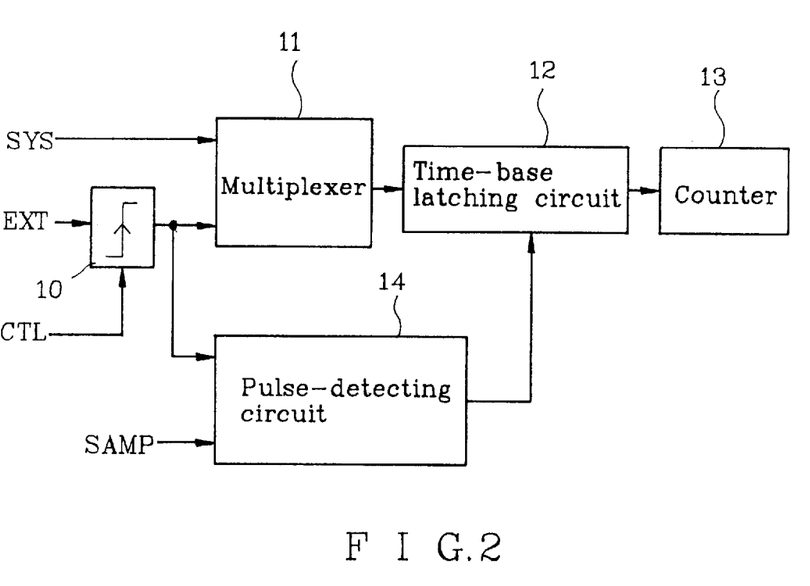
FIG. 2 is a block diagram of the circuit according to the present invention.
Figure 7:
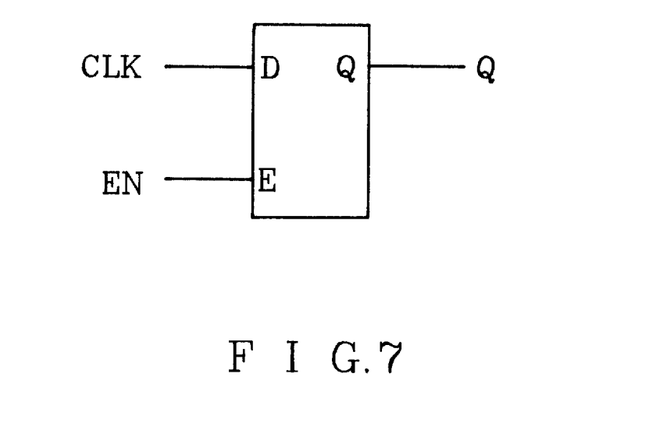
FIG. 7 is a digital logic embodiment according to the present invention.
Figure 8:
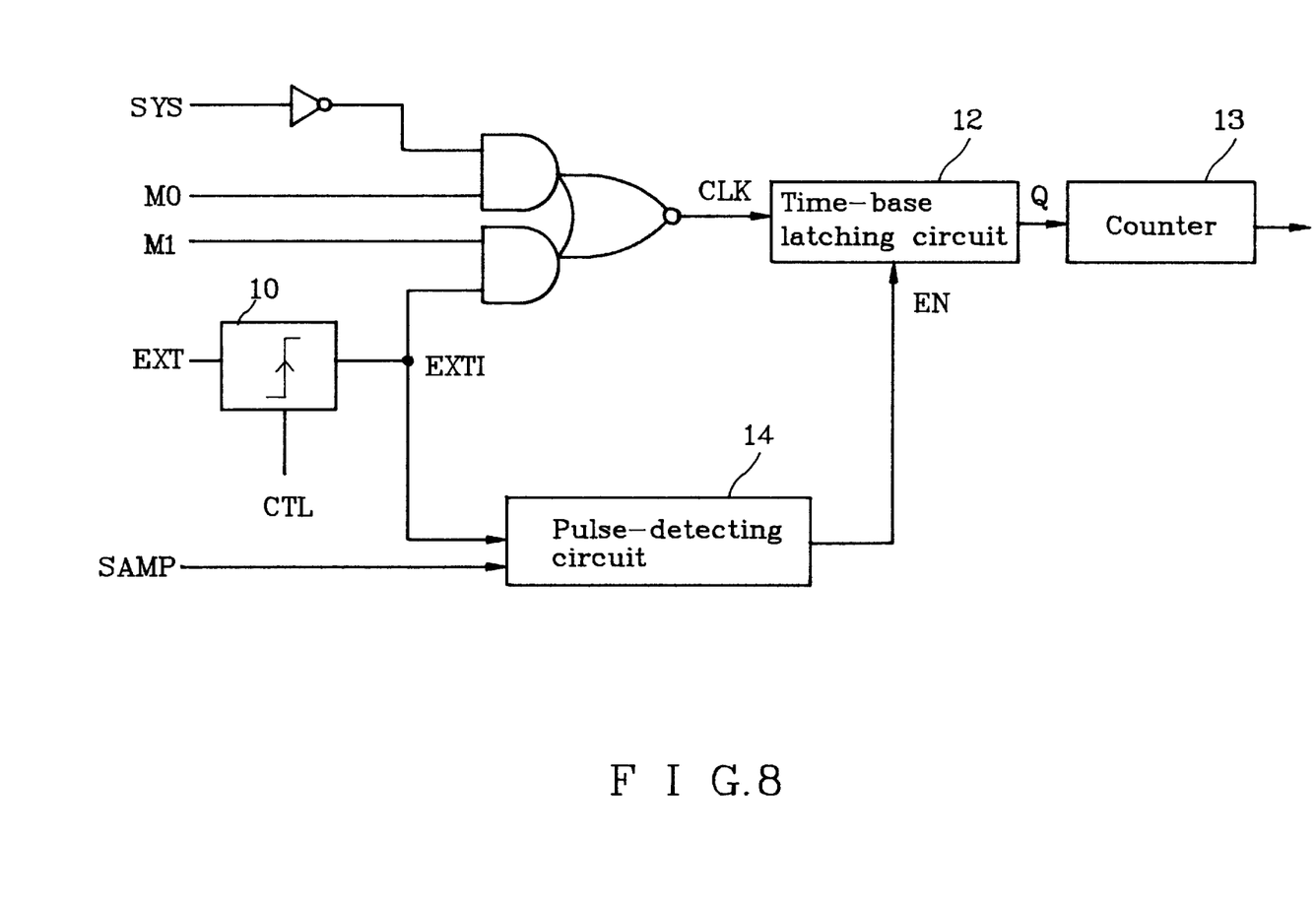
FIG. 8 is a digital logic circuit of a pulse-detecting circuit according to the present invention.
Figure 9:
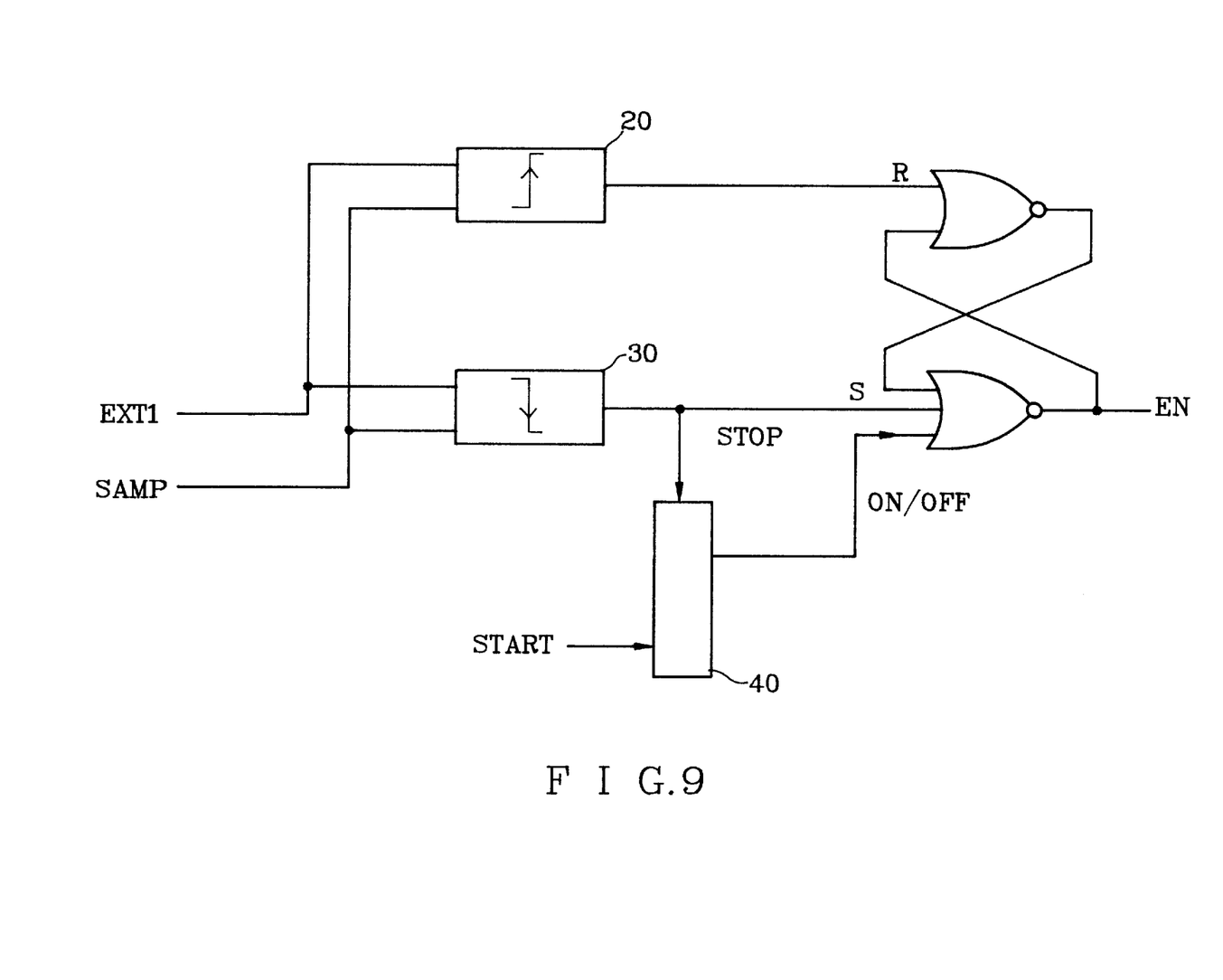
FIG. 9 is digital logic circuit of a pulse-detecting circuit according to the present invention.
Figure 10:
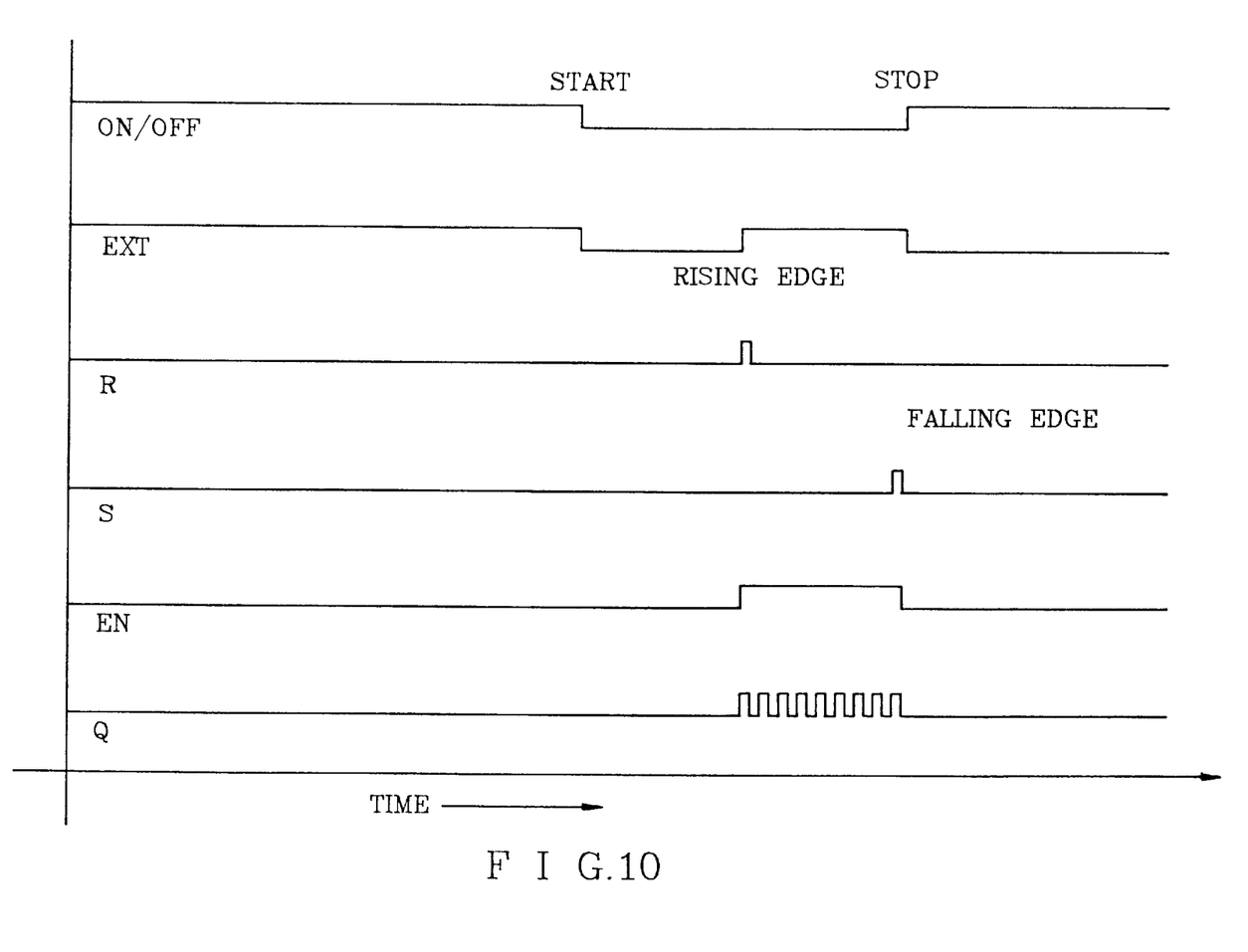
FIG. 10 is a digital logic circuit embodiment of the pulse-detecting circuit according to the present invention.
Figure 11:
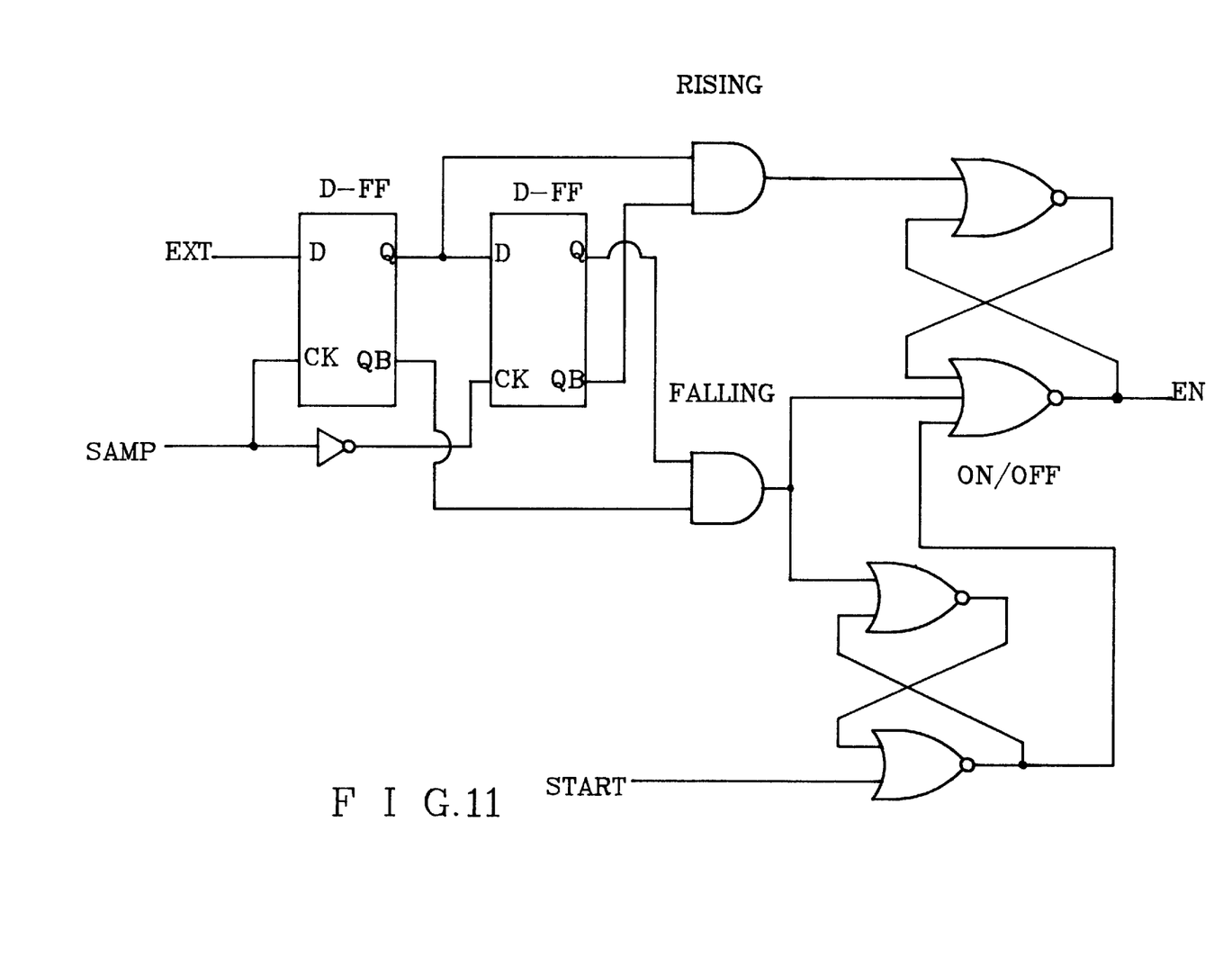
FIG. 11 is a digital logic circuit embodiment of the pulse detecting circuit according to the present invention

Referring to FIG. 2, the block diagram according to the present invention is different from a conventional counter, i.e., a pulse-detecting circuit (14) and a time-base latching circuit (12) are added thereto. FIG. 8 is an embodiment of a digital logic diagram, in which the input terminals of the pulse-detecting circuit (14) are connected with the output terminal of the edge-triggered controller 10 and a sampling signal, while the output terminal of the pulse-detecting circuit (14) and thereof is connected with one of input terminals of the time-base latching circuit (12). FIG. 9 is a digital logic circuit of the pulse-detecting circuit (14) of the present invention, which includes a positive edge-detecting circuit 20, a negative edge-detecting circuit 30, a starting register 40 and a RSV latching circuit; the positive edge-detecting circuit 20 is used for detecting a positive edge signal of an external triggering signal EXT1, and uses the sampling signal SAMP for turning on the time-base latching circuit (12) when the external triggering signal EXT1 is at a positive edge signal. The negative edge-detecting circuit 30 is used for detecting a negative edge signal of the external triggering signal EXT, uses the sampling signal for turning off the time-base latching circuit (12) when the external triggering signal EXT1 is a negative edge signal; the starting register 40 is used for controlling the survey to start and to stop; the input terminals thereof are provided with a starting signal START and a stop signal STOP from the negative edge-detecting circuit 30. The starting register 40 provides an output of ON/OFF signal to the RSV latching circuit which can latch a signal for generating an enabling signal EN so as to start or to turn off the time-base latching circuit (12); the related timing diagram of the aforesaid circuit is shown in FIG. 10. FIG. 11 is an embodiment of the digital logic circuit of the pulse-detecting circuit (14) according to the present invention, in which the positive edge-detecting circuit 20 and the negative edge-detecting circuit (30) include two D-type flip-flop, a logic AND gate and a NOT gate. The starting register 40 includes another RSV latching circuit. Further, the time-base latching circuit (12) is substantially a D-type latching circuit, of which the input terminals are provided with clock signal CLK and an enabling signal EN, while the output terminal thereof will supply a counting clock signal Q sent to the counter (13). FIG. 7 is a digital logic circuit of the time-base latching circuit according to the present invention.

In brief, the present invention can provide a function of detecting the pulse width of an external signal EXT; i.e., the width of an external signal EXT pulse can be obtained by controlling the edge-triggered controller 10; the pulse-detecting circuit (14) can be used for controlling and surveying the number of the external signals EXT before counting the same. The present invention still possesses another two operation modes of the conventional counter.

I claim:

1. A timer which provides both surveying and counting functions comprising:

a counter, a multiplexer, an edge-triggered controller, a time-base latching circuit and a pulse-detecting circuit;

said multiplexer being provided with input terminals to receive signal from a system clock and output triggering signal from said edge-triggered controller;

said pulse-detecting circuit being provided with input terminals to receive a sampling signal and said output triggering signal from said edge triggered controller;

said pulse-detecting circuit being provided with an output terminal for sending out an enabling signal to be transmitted to said time-base latching circuit; said multiplexer also being provided with an output terminal for sending a clock signal to said time-base latching circuit;

said time-base latching circuit being connected with said counter to generate an output required.

2. The timer which provides both surveying and counting functions as claimed in claim 1, wherein said pulse-detecting circuit includes a positive edge-detecting circuit, a negative edge-detecting circuit, a starting register, and a RS latching circuit;

said output triggering signal and said sampling signal being sent to said positive edge-detecting circuit, and said negative edge-detecting circuit, and output thereof being transmitted to said RS latching circuit;

said starting register being provided with input terminals for receiving a starting signal and a stop signal, wherein said stop signal being sent from output terminal of said negative edge-detecting circuit;

said starting register being provided with means for sending out an ON/OFF signal; and said ON/OFF signal being sent to said RS latching circuit to generate said enabling signal.

3. The timer which provides both surveying and counting functions as claimed in claim 2, wherein said positive edge-detecting circuit includes D-type flip-flop, logic NOT gate and AND gate.

4. The timer which provides both surveying and counting functions as claimed in claim 2 wherein said negative edge-detecting circuit include D-type flip-flop, logic NOT gate and AND gate.

5. The timer which provides both surveying and counting functions as claimed in claim 2, wherein said starting register is a RS flip-flop.

6. The timer which provides both surveying and counting functions as claimed in claim 1, wherein said time-base latching circuit is a D-type latching circuit.

7. A timer which provides the functions of both surveying and counting, comprising:

a system clock; an external signal; a sampling signal; a counter; a multiplexer; an edge-triggered controller; a time-base latching circuit; and a pulse-detecting circuit;

wherein said multiplexer being provided with input terminals which are connected to said system clock to receive a system clock therefrom and to said edge-triggered controller to receive an external triggering signal therefrom;

said multiplexer further being provided with means for encoding and thus producing an output signal which can be either said system clock or said external triggering signal, or both, so as to provide three different modes of operations;

said edge-triggered controller being provided with input terminals for receiving said external signal and a control signal select for encoding the phase of said external signal to generate said external triggering signal, which is sent to said multiplexer and said pulse-detecting circuit;

said pulse-detecting circuit being provided with input terminals which are connected to receive said sampling signal and said external triggering signal, and means for generating and sending an enabling signal to said time-base latching circuit;

said time-base latching circuit being provided with input terminals to receive the output from said multiplexer and said enabling signal from said pulse-detecting circuit, and means for generating and sending an output signal to said counter.

8. The timer which provides the functions of both surveying and counting according to claim 7 wherein:

said pulse detecting circuit comprises a positive edge-detecting circuit, a negative edge-detecting circuit, a starting register, and an RS latching circuit;

said external triggering signal and said sampling signal being sent to input terminals of both said positive edge-detecting circuit and said negative edge-detecting circuit;

said positive edge-detecting circuit and said negative edge-detecting circuit generate outputs which are sent to said RS latching circuit;

said starting register is connected to a starting signal and a stop signal, said stop signal being sent from said negative edge-detecting circuit;

said starting register contains means to generate and send an ON/OFF signal to said RS latching circuit;

said RS latching circuit contains means to generate said enabling signal for said pulse-detecting circuit.

* * * * *